United States Patent [19]
Asselta et al.

[11] Patent Number: 5,875,101
[45] Date of Patent: Feb. 23, 1999

[54] COMPUTER SYSTEM WITH IMPROVED POWER BUS

[75] Inventors: John Anthony Asselta, Endicott; Albert Lawrence Balan, Endwell; Stephen Boyko, Conklin; James Edward Myers, Lisle, all of N.Y.

[73] Assignee: International Business Machines Corporation, Armonk, N.Y.

[21] Appl. No.: 745,076

[22] Filed: Nov. 7, 1996

Related U.S. Application Data

[62] Division of Ser. No. 478,294, Jun. 7, 1995, abandoned, which is a division of Ser. No. 145,815, Nov. 2, 1993, Pat. No. 5,532,907.

[51] Int. Cl.$^6$ ...................................................... H01R 9/00
[52] U.S. Cl. ............................................ 361/775; 439/845
[58] Field of Search .................................... 439/212, 214, 439/845; 361/775, 648; 174/72 B

[56] References Cited

U.S. PATENT DOCUMENTS

| | | | |
|---|---|---|---|
| 2,741,753 | 4/1956 | Mekelburg | 439/502 |
| 3,212,046 | 10/1965 | Abel et al. | 439/502 |
| 3,325,769 | 6/1967 | Travis | 439/496 |
| 3,510,963 | 5/1970 | Zbar et al. | 361/775 |
| 3,567,999 | 3/1971 | Larson | 174/253 |
| 3,587,030 | 6/1971 | Ohnsorg et al. | 439/502 |
| 3,634,819 | 1/1972 | Evans | 439/825 |
| 3,670,208 | 6/1972 | Hovnanian et al. | 361/777 |
| 3,851,294 | 11/1974 | Palazzetti et al. | 429/272 |
| 3,923,364 | 12/1975 | Shapiro et al. | 439/493 |
| 4,046,445 | 9/1977 | Anhalt | 439/109 |
| 4,682,838 | 7/1987 | Piper et al. | 439/92 |
| 4,719,541 | 1/1988 | Ono et al. | 361/775 |
| 4,771,366 | 9/1988 | Blake et al. | 361/705 |
| 4,802,866 | 2/1989 | Balzano et al. | 439/496 |
| 4,834,673 | 5/1989 | Beinhaur et al. | 439/422 |
| 4,867,696 | 9/1989 | Demler, Jr. et al. | 439/212 |
| 4,905,123 | 2/1990 | Windle et al. | 361/710 |
| 4,913,662 | 4/1990 | Noy | 429/498 |
| 5,035,639 | 7/1991 | Kilbratrick et al. | 439/290 |
| 5,365,424 | 11/1994 | Deam et al. | 363/144 |

FOREIGN PATENT DOCUMENTS

| | | | |
|---|---|---|---|
| 63-302588 | 9/1988 | Japan | 439/212 |

OTHER PUBLICATIONS

Adams, et al., "High Current Laminar Bus," Jul., 1979 IBM Technical Disclosure Bulletin (vol. 22, No. 2), pp. 527–528.

Adams, et al., "High Current Carrying Modular Laminar Bus," Jul., 1981, IBM Technical Disclosure Bulletin (vol. 24, No.2), pp. 1239–1240.

Rieley, "Laminated Bus System," Jan., 1970, IBM Technical Disclosure Bulletin (vol. 12, No. 8), pp. 1268–1269.

*Primary Examiner*—Neil Abrams
*Attorney, Agent, or Firm*—Calfee, Halter & Griswold LLP

[57] ABSTRACT

A multi-layer power bus (18) is described that includes input tabs (24) and three legs (32, 34, and 36) and that connects a matrix of power supplies to a circuit board (12) in a computer system. The power bus (18) is substantially planar and attached to the circuit board (12) so that the power bus (18) and circuit board (12) are parallel to one another. This parallel relationship decreases the amount of space utilized by the circuit board (12) in the computer system. The circuit board (12) also has connectors for delivering power directly to tabs (72, 74) on circuit board (12) which increases the efficiency of power delivery. Each connector (44) includes a U-shaped spring housing (48) located within a hollow shield (52) and is joined to one of the power bus voltage layers by a braided copper cable (46).

17 Claims, 9 Drawing Sheets

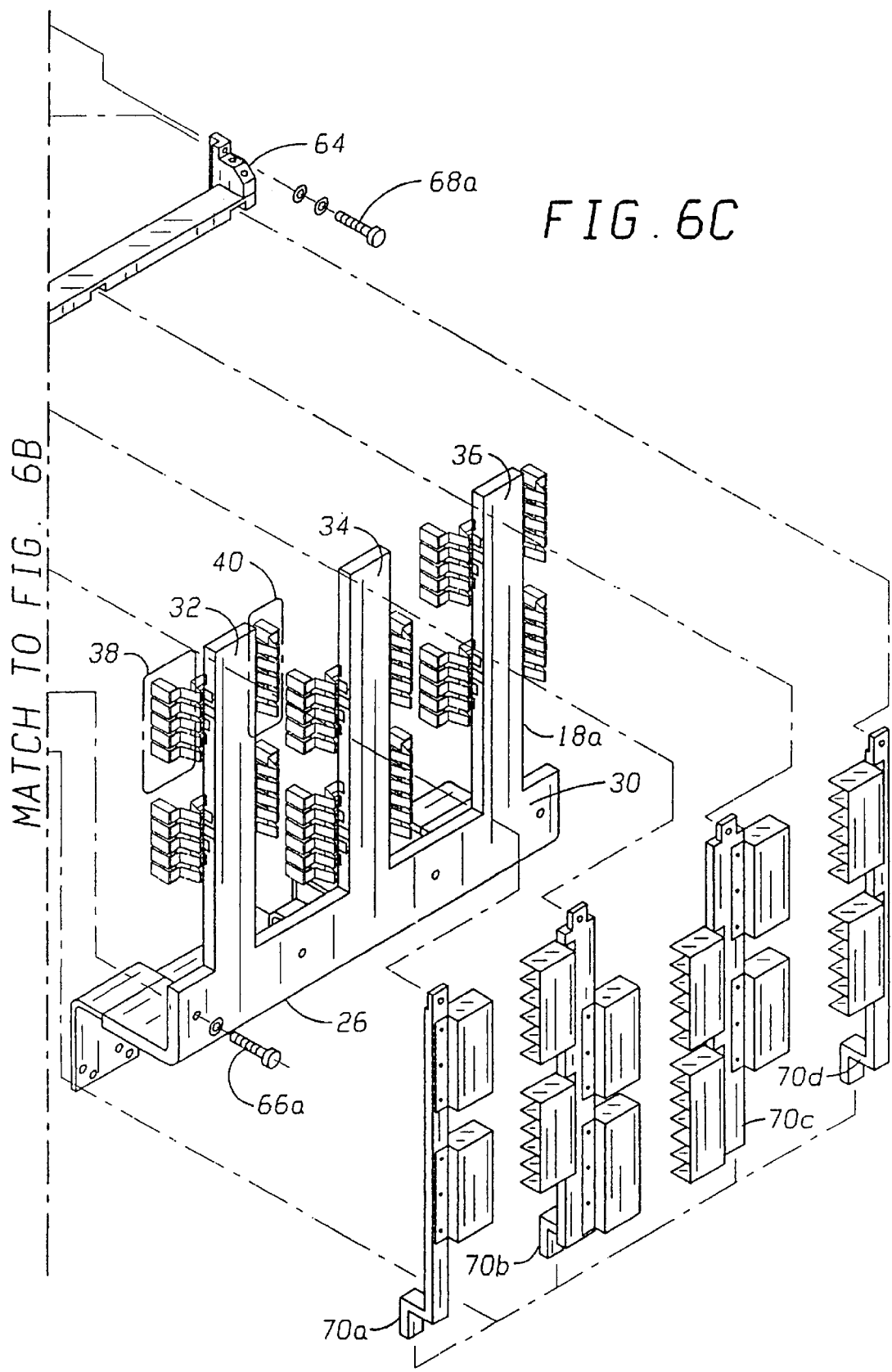

COMPUTER SYSTEM WITH IMPROVED POWER BUS

This is a divisional of application Ser. No. 08/478,294, filed on Jun. 7, 1995, now abandoned, which is a divisional application of Ser. No. 08/145,815, filed Nov. 2, 1993, and issued as Pat. No. 5,532,907.

FIELD OF THE INVENTION

The present invention relates generally to computer systems and more specifically to a computer system that has an improved bus for transmitting electric power from a power supply to the electronic components that comprise the computer system.

BACKGROUND OF THE INVENTION

A computer system is actually comprised of numerous, individual electronic components such as resistors, capacitors and transistors. To combine these electronic components into the thousands of circuit configurations that eventually comprise the entire computer system, the components are either directly "wired" into sheets of resistive material that contain various patterns of conductive materials in them ("circuit boards"); or are contained in integrated chips manufactured from semi-conductive materials, which are generally known simply as "chips". These chips are then usually wired into the circuit boards.

Several circuit boards are connected together by various means to make up the overall computer system. A computer system may be comprised of hundreds of circuit boards, each containing thousands of electronic components and chips all connected together in various circuit configurations.

As computer systems continuously evolve, it is desirable to improve their features, function and capabilities in every respect. For instance, each new generation of computer system is designed with more memory capability, functions faster, performs more functions and is simpler to operate for users than the previous generation.

The method by which these continual computer enhancements are achieved is by adding ever more chips and electronic components and/or replacing old electronic components and chips with new and improved versions. For example, if more memory is needed in a particular computer system, then more memory chips are added; or, if it is desirable that a computer function faster, then the central processing unit (CPU) is replaced with a larger one or an improved one that is comprised of more electronic components and chips.

When a computer system is updated by adding new and larger components or chips to the system, the number of circuit boards that comprise the overall computer system must eventually be increased. The constant addition of electronic components and chips or the replacement of outdated chips with new, larger and improved ones has created configuration problems in present computer systems.

One problem is that there is simply not enough space in the computer system to accommodate all of the additional circuit boards required for the new chips and components. Indeed, space is at a premium in all modern computer systems. Thus, it is desirable to design new computer systems with as many "space saving" features as possible.

One known method of conserving space in a computer system is to concentrate as many chips as possible in a small, enclosed device that is then wired into the circuit board. For example, I.B.M. Corporation manufactures a device that is called a "Thermal Controlled Module", which contains 110 chips ("TCM"). A TCM is comprised of a rectangular-shaped, ceramic substrate populated with approximately 110 chips. A TCM requires at least 2,500 connections to the circuit board accomplished with an array of pins on the bottom of the TCM. A more detailed description of the structure and function of TCM's is provided in IBM Journal of Research & Development 26(1): pp. 30–36, January, 1982, which is incorporated herein by reference.

The design of devices such as the TCM, in which a large concentration of chips is contained, has created other problems. One problem is that these devices require a tremendous amount of power to function. Indeed, supplying the huge amounts of power required by new and updated chips and electronic devices such as the TCM is a problem throughout modern computer systems in general.

Accordingly, large power buses must be used to carry the requisite amount of power from power supplies to the circuit boards in a modern computer system. These large power buses complicate and add to the space problem discussed above, because they consume even more space in the computer system.

Yet another problem with modern computer systems is that the improved components of the system, such as TCM's, require not only huge amounts of power, but power that is supplied at different voltage levels. Thus, even larger power buses are required to supply the power at various levels, again adding to the space problem within the overall computer system.

The shear magnitude of power at different voltage levels required by the components that comprise modern computer systems has also created problems in the design of power buses and the means used to attach them to circuit boards. The usual method for attaching power buses to circuit boards is to solder perpendicular tabs extending from the output end of the bus to pads on the end of the circuit board, so that the bus and circuit board are attached perpendicular to one and other. This method creates several problems when used in a modern computer system.

One problem is inefficiency. Because the power bus is attached to the solder pads instead of directly to the main load contained on the circuit board (possibly a TCM or several TCM's), the power must be transmitted through conductors provided at different levels of the circuit board to the load. Accordingly, power is needlessly lost as it is transmitted through the board conductors to the load. In most instances, this power loss is significant because the power must travel across clearance hole areas manufactured into the conductors. A clearance hole area insulates an electrical connection, such as a signal or different power connection, from the power carried in a particular conductor. These clearance hole areas effectively act as resistors, and thus, power is lost as it travels across them.

Another problem associated with the known method of attaching power buses to circuit boards is that, because the power bus is attached to the board in the same perpendicular plane that the TCM's, input/output devices (I/O's) and other devices are attached to the board, it's mechanical bulk consumes potential component placement sites and restricts their usage.

Yet another problem is that this known method of delivering power to circuit boards often requires more than one power bus; usually four, are required to deliver power to the board. Each of these buses are attached to the front plane of a board assembly with the axis of each bus being perpendicular to the plane of the board to provide the maximum amount of room for components. This orientation, although it reduces the space consumed by the four power buses, still unnecessarily consumes potential component space.

Yet another problem with the known method of attaching power buses to circuit boards is that the bus cannot be easily removed from the circuit board because they are soldered together. Thus, the service and rework times for the board assembly is increased unnecessarily.

Accordingly, it is the object of the present invention to provide a computer system that has a power bus which decreases the space required to accommodate it in the computer system. Another object of this invention is to provide a computer system that has a power bus which provides different levels of voltage to a circuit board with a minimum use of space.

A further object of this invention is to provide a computer system that has a power bus that may be connected directly to a large load, for example a TCM, to minimize or eliminate the space required on a circuit board to connect the bus to the load.

Yet another object of this invention is to provide a computer system that has a power bus that can be quickly attached to and detached from a circuit board to provide easy maintenance of either one.

SUMMARY OF THE INVENTION

A power bus is disclosed that connects a matrix of power supplies to a circuit board in a computer system. The power bus is substantially planar and attached to the circuit board so that the power bus and circuit board are parallel to one another. This parallel relationship decreases the amount of space utilized by the circuit board in the computer system. The circuit board also has connectors for delivering power directly to a power consuming device which increases the efficiency of power delivery. These connectors are pluggable which allows easy removal from the circuit board.

DETAILED DESCRIPTION OF THE PREFERRED EMBODIMENT

Figure 1:
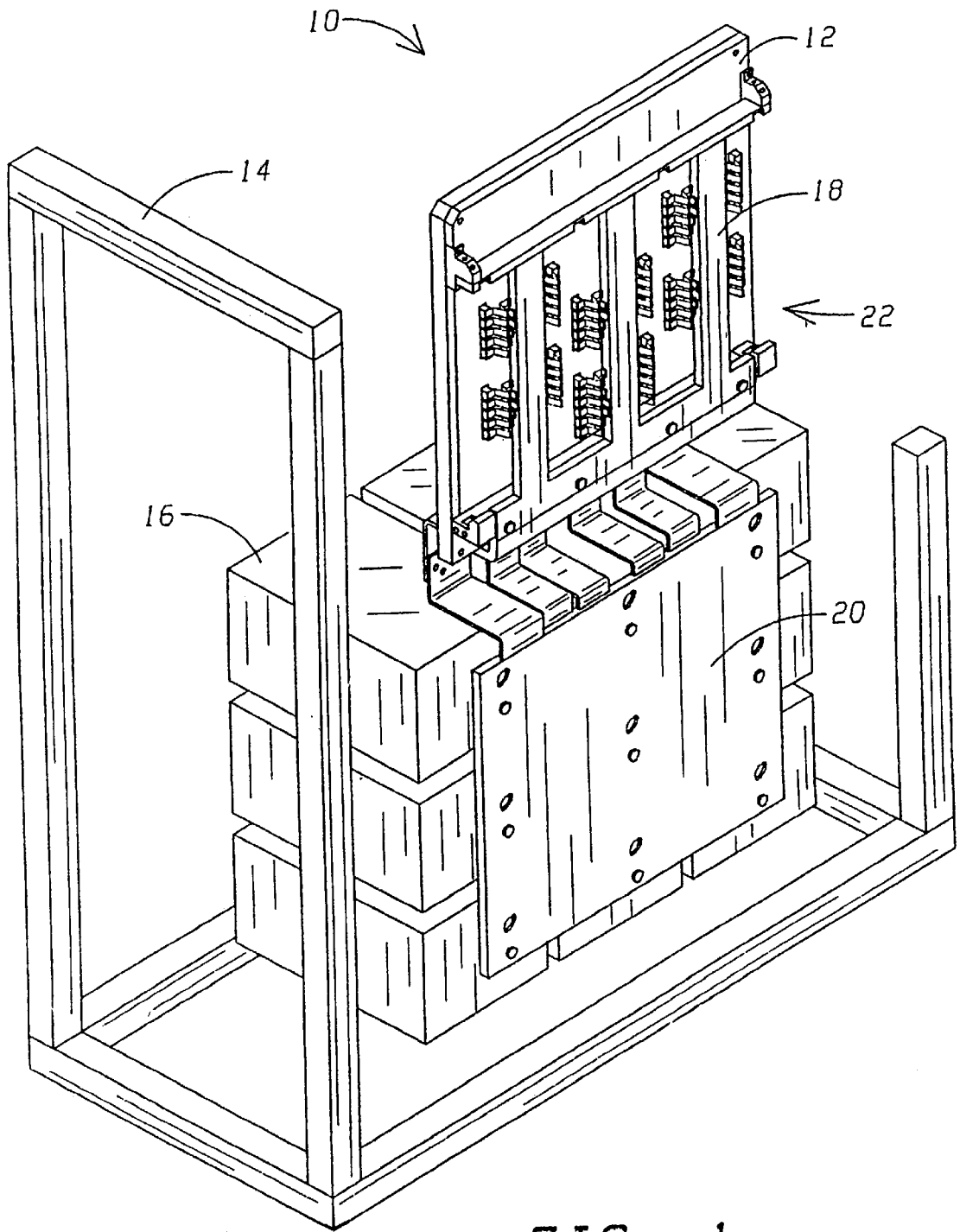
FIG. 1 depicts a circuit board/power supply assembly of a computer system having a power bus of the present invention.

Referring now to FIG. 1, one circuit board/power supply assembly 10 of a computer system is shown. The computer system is actually comprised of a plurality of circuit board/power supply assemblies that are connected together, each being contained within its own rectangular housing. The circuit board/power supply assemblies in the preferred embodiment are so large that they each require their own housing. However, more than one assembly may be contained in a larger housing if the system designer desired such a configuration. Each circuit board/power supply assembly of the computer system is similar, if not identical, in construction and operation to the assembly 10 shown in FIG. 1.

Referring specifically now to the assembly 10 shown in FIG. 1, it is comprised of a circuit board 12 that has several of the electronic components of the computer system connected to it. The circuit board 12 is mounted in a housing 14 which encloses and protects the circuit board of the computer system. (The walls of housing 14 are actually comprised of a solid non-transparent material, such as steel, but are shown as transparent in FIG. 1 so that assembly 10 can be viewed.) The assembly 10 also has a matrix of power supplies 16 mounted within the housing that provides the power required by the components of the computer system connected to circuit board 12. The matrix of power supplies 16 may be comprised of any known power supplies presently used to provide power in computer systems. A single power supply could be substituted for the power supply matrix 16; however, the power requirements of the preferred embodiment dictate that a matrix of power supplies be used. The power supplies that comprise matrix 16 are actually bolted to the bottom of housing 14 and, as more fully described below, circuit board 12 is mounted on the power supplies.

The circuit board 12 is substantially planar and arranged vertically in the housing 14, such that the back of the circuit board 12 faces outwardly from the back of the housing 14. The circuit board 12 is rectangular in shape.

The circuit board 12 has a new and inventive power bus 18, connected to it. The power supplies 16 are then connected to each power bus 18 through known power transmission means, such as a power plate bus 20. Power plate bus 20 is bolted to the power supplies and electrical connections (not shown) are made from the power supplies to different layers of conductive material within plate bus 20. Thus, power is delivered from the power supply matrix 16, through the plate bus 20 and power bus 18, to the circuit board 12.

Power bus 18 is substantially planar, and connected to circuit board 12, as more fully described below, such that it is parallel to the circuit board and coextensive with the rectangular shape of the circuit board. Thus, in FIG. 1, the circuit board 12 is partially hidden from view by power bus 18.

Figure 2:
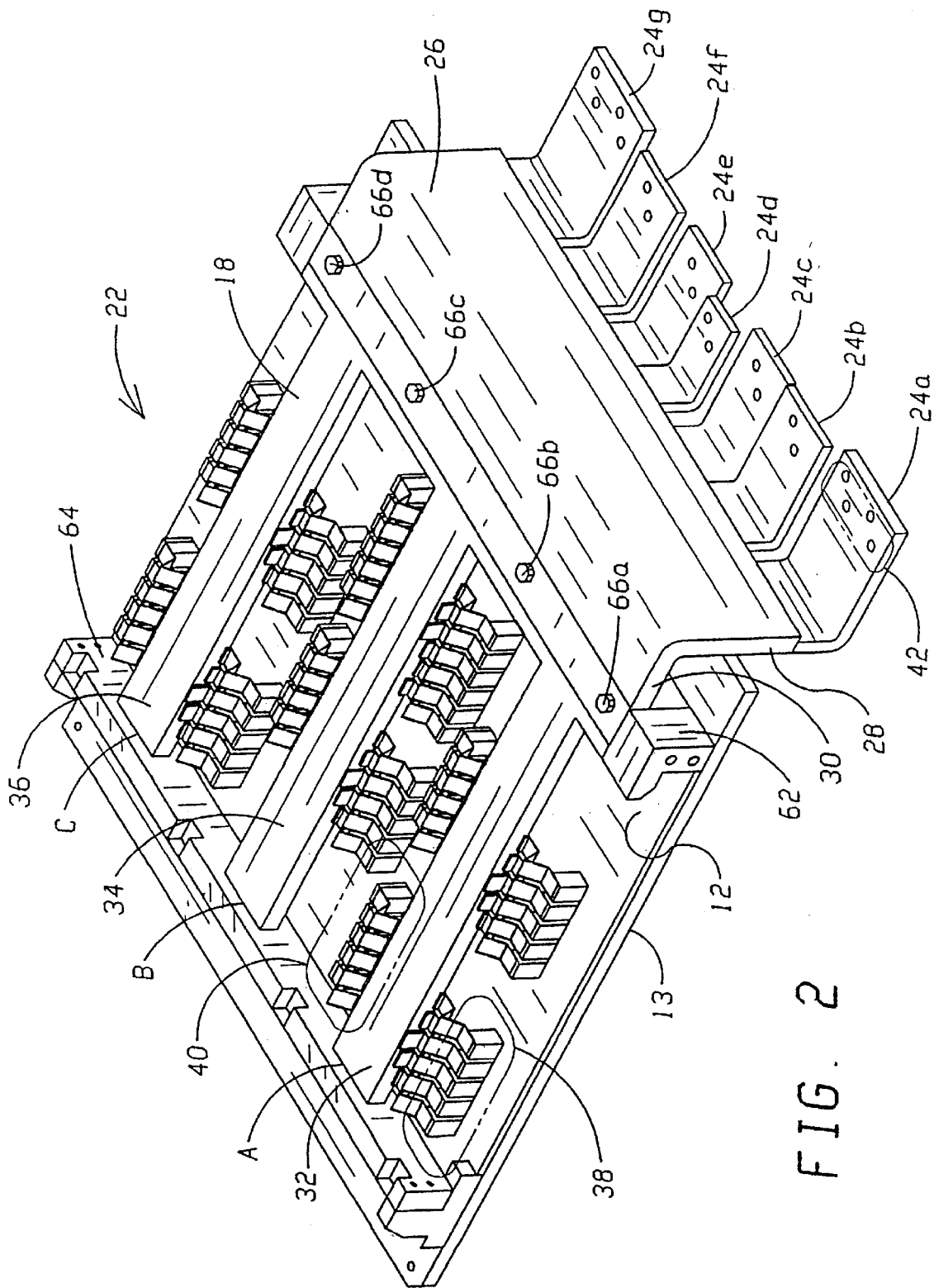
FIG. 2 is an assembly of the power bus and circuit board of FIG. 1.

Referring now to FIG. 2, an assembly 22 of power bus 18 connected to circuit board 12 is shown. Although FIG. 2 shows assembly 22 on a horizontal axis, assembly 22 is mounted in an upright, vertical position when mounted in housing 14 as shown in FIG. 1.

The bottom of power bus 18 has seven, planar input tabs 24a–g that extend downward when power bus 18 is mounted in housing 14. Each of the tabs 24a–g has a 90° bend such that each tab is L-shaped. The longer section or leg of each tab extends downwardly from the 90° bend when assembly 22 is mounted in housing 14. The shorter leg of each tab extends horizontally from the 90° bend towards the back of housing 14 when assembly 22 is mounted in housing 14.

Each of the shorter legs of the tabs 24a–g is actually an extension from a different layer of a commoning section 26 of bus 18. Commoning section 26 is also substantially planar and L-shaped with a 90° bend. Commoning section 26 has a first portion 28 that is horizontal when assembly 22 is mounted in housing 14. Each of the shorter, horizontal legs of tabs 24a–g extend from the horizontal portion 28 of commoning section 26.

Commoning section 26 also has a second portion 30 that is vertical when assembly 22 is mounted in housing 14. Vertical portion 30 is attached to three, vertical bus legs 32, 34 and 36. Commoning section 26 "commons" the bus legs 32, 34 and 36 and tabs 24a–g into the single power bus 18, and thus, allows power to be distributed from the tabs 24a–g, through this common area to the bus legs 32, 34 and 36. Bus legs 32, 34 and 36 are connected to the circuit board 12 through a multitude of pluggable, V-shaped connectors attached to both sides of bus legs 32, 34 and 36 (one bank or group of such V-shaped connectors connecting bus leg 32 to circuit board 12 is identified as 38 in FIG. 2, and another bank is identified as 40). The structure and operation of each of the V-shaped connectors, which are discussed more fully below, are identical.

Figure 3:
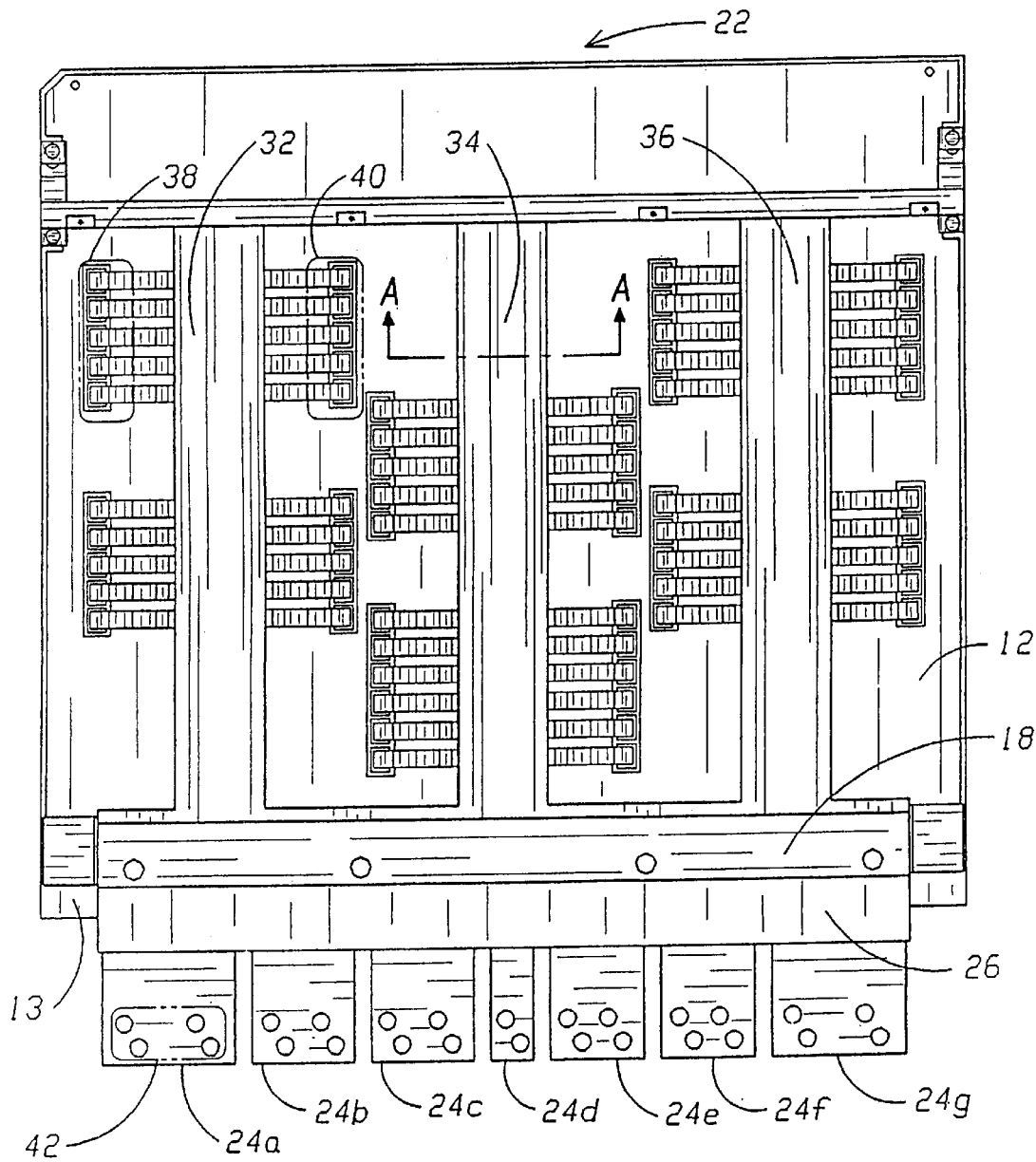
FIG. 3 is a back view of the assembly of FIG. 2.

Referring now to FIG. 3, a back view of assembly 22 is shown. Accordingly, bus legs 32, 34 and 36 as well as tabs 24a–g are vertical. FIG. 3 depicts the back of assembly 22 and bus 18 in their actual position when mounted in housing 14.

Power bus 18 is actually comprised of four layers of conductive metal, such as copper, that are laminated together with any known insulating material, such as fiberglass, kevlar, kapton or tedlar, between each layer. A single, unitary sheet of each conductive layer is machined into the physical configuration of power bus 18 shown in FIG. 2, including bus legs 32, 34 and 36, commoning section 26 and one or two of the tabs 24a–g that extend -from that particular layer. Each of the layers is then bent into the shape of power bus 18 and laminated together with the other layers using known manufacturing processes to form power bus 18. Finally, all exterior metal, except tabs 24a–g and the tabs to which the V-shaped connectors are attached, is covered with an insulator, such as tedlar, for safety purposes. When the manufacturing process is complete, power bus 18 is twenty (20) inches wide and twenty (20) inches in height. Power bus 18 is also 1.5 inches thick with a seven (7) inch offset between the 90° bends and weighs approximately 100 lbs.

Figure 4:
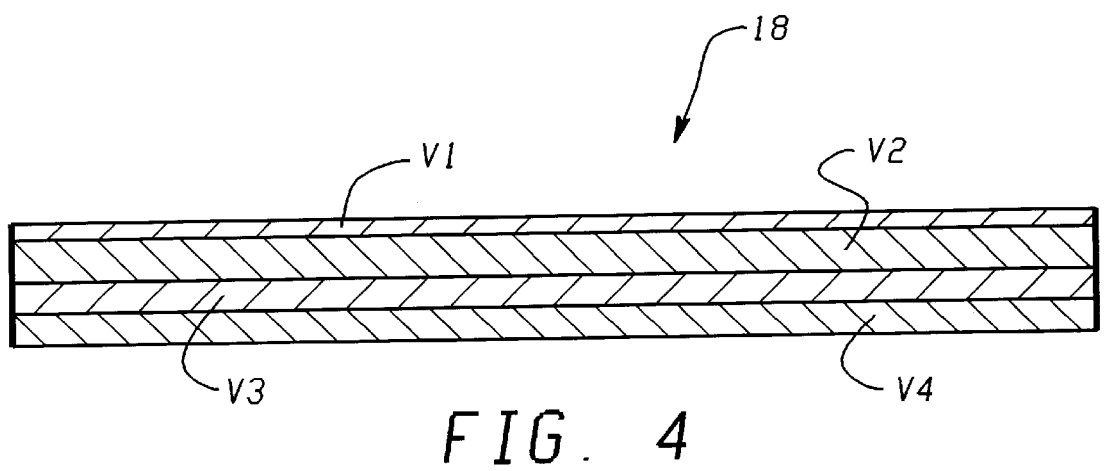
FIG. 4 is a cross-section of a bus leg of the power bus of FIGS. 2 and 3.

Each layer of conductive metal in power bus 18 carries a different voltage potential required to operate the electronic components connected into circuit board 12. Referring now to FIG. 4, the four layers of power bus 18 are shown in a cross-section of bus leg 34 along line A of FIG. 3. The top or first layer of power bus 18 carries a reference voltage and is labeled $V_1$. The smallest input tab 24d extends from this layer. The second layer of power bus 18 carries a negative voltage and is labeled $V_2$. Input tabs 24b and 24f extend from layer $V_2$. The third layer of power bus 18 is labeled $V_3$ and carries a positive voltage. Input tabs 24c and 24e extend from the layer labeled $V_3$. Finally, the fourth layer of bus 18, labeled $V_4$, is common or ground to the voltages carried by the first three layers. Input tabs 24a and 24g are the ground input tabs that extend from layer $V_4$.

As stated above, each of the tabs 24a–g is actually an extension of one of the layers of power bus 18. Each of these tabs is connected, through plate bus 20, to a particular voltage level generated by power supply matrix 16. Accordingly, power supply matrix 16 supplies a selected voltage to each layer of power bus 18 through the corresponding tab that is an extension of that layer.

Each of the four layers of power bus 18 may be required to conduct a different amount of current. Thus, the sizes of tabs 24a–g and the thicknesses of the four layers may vary. For example, in the preferred embodiment shown in FIG. 4, layer $V_1$ conducts the least amount of current, and, therefore is the thinnest layer and only has a single, narrow input tab 24d extending from it. Layers $V_2$ and $V_3$ are required to conduct more current, and thus, are thicker than $V_1$ and each have two input tabs. Layer $V_4$ is the thickest layer and also requires two tabs because it returns all of the current to power supply matrix 16 that passes through the other three layers.

The tabs 24a–g are attached to the plate bus 20 by bolts that pass through clearance holes that are in each tab. For example, tab 24a is attached to plate bus 20 by bolts that pass through a set of four clearance holes 42 shown in FIGS. 2 and 3.

Figure 5:
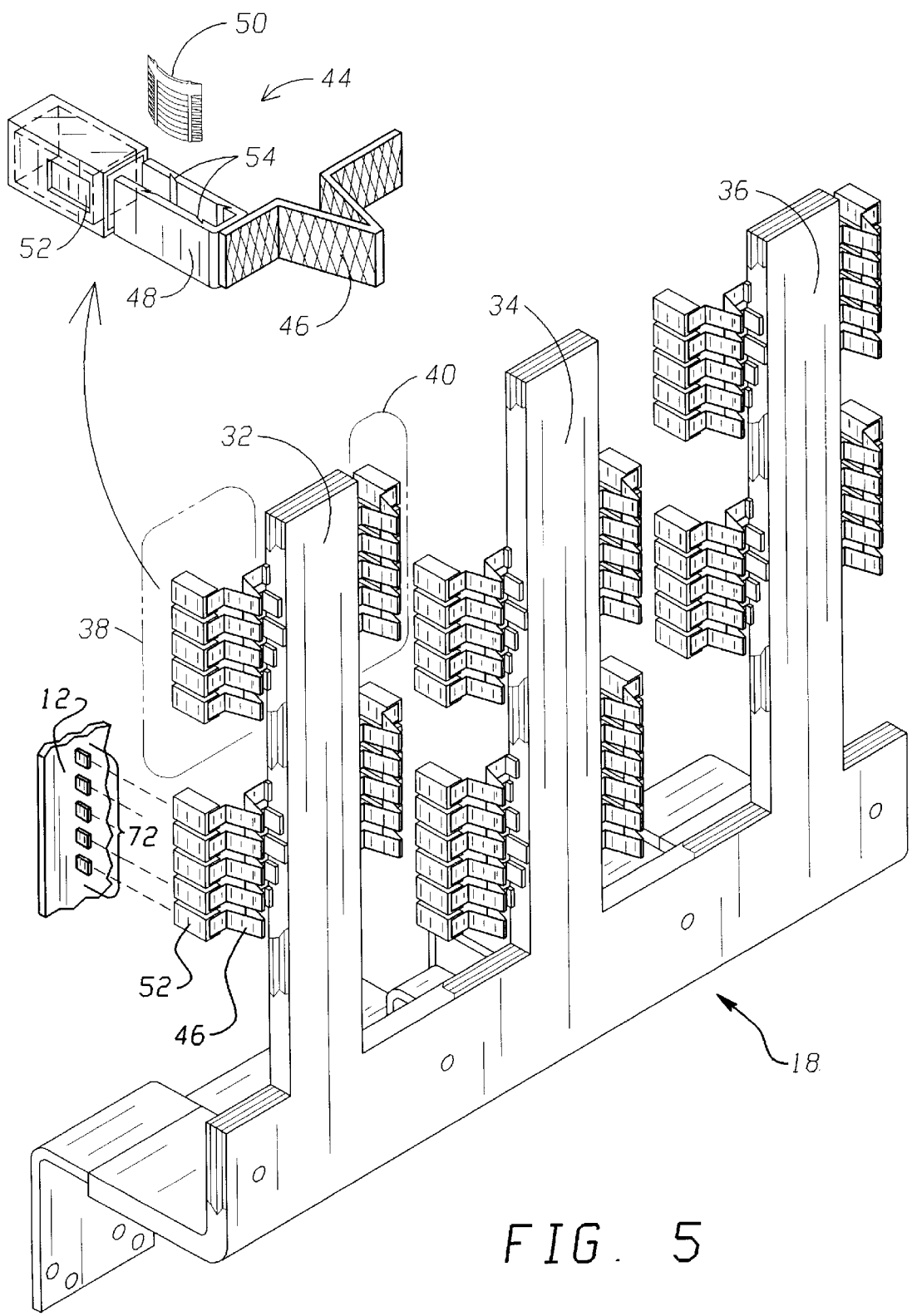
FIG. 5 is the power bus of FIG. 2 and a pluggable, V-shaped connector used to connect the circuit board of FIG. 2 to the power bus.

Referring now to FIG. 5, power bus 18 is shown in a vertical position and an exploded view of a V-shaped connector 44 from bank of V-shaped connectors 38 is also shown. All of the V-shaped connectors attached to power bus 18 are sonically welded to tabs that protrude from the various conductive layers of power bus 18. Thus, each V-shaped connector carries one of four voltage potentials to circuit board 12 depending upon the particular layer of power bus 18 that it is connected to. For example, if a particular V-shaped connector is sonically welded to a tab protruding from the first conductive layer of bus bar 32, it conducts the voltage $V_1$ to circuit board 12.

Connector 44 is identical in structure and operation to all the other connectors attached to power bus 18. Connector 44 is comprised of a V-shaped braided copper cable 46, a U-shaped spring housing 48 that is gold-plated copper, two gold-plated, beryllium-copper louvered spring contacts 50 (only one shown) and a hallow plastic shield 52. One end of the braided cable 46 is sonically bonded to the spring housing 48 which contains grooves 54 in its interior walls into which the spring contacts 50 are inserted. Spring housing 48 is then inserted into and contained by plastic shield 52.

The connection to the circuit board 12 is made by placing the spring housing 48 containing the spring contacts 50 and plastic shield 52 over and onto a gold-plated, copper tab soldered to and extending perpendicularly from the circuit board 12 (not shown) until the bottom of the spring housing 48 touches the circuit board 12 at the bottom of the tab. The opposing spring contacts 50 exert forces on opposite sides of the board tab such that they firmly grip the tab. The V-shape in the heavy braided cable of the V-shaped connectors provides flexibility while not imparting any side loads on the solder joints of the tabs of the circuit board 12. Electrical continuity from circuit board 12 to power bus 18 is accomplished from the board tab; through spring contacts 50, spring housing 48 and braided cable 46; to bus leg 32.

Connector 44 can be manually disconnected from circuit board 12 simply by pulling the plastic shield 52 with the spring housing 48 off of the tab extending from circuit board 12. Accordingly, maintenance on circuit board 12 and, moreover, the entire computer system, can be performed quickly and efficiently.

Figure 6A:
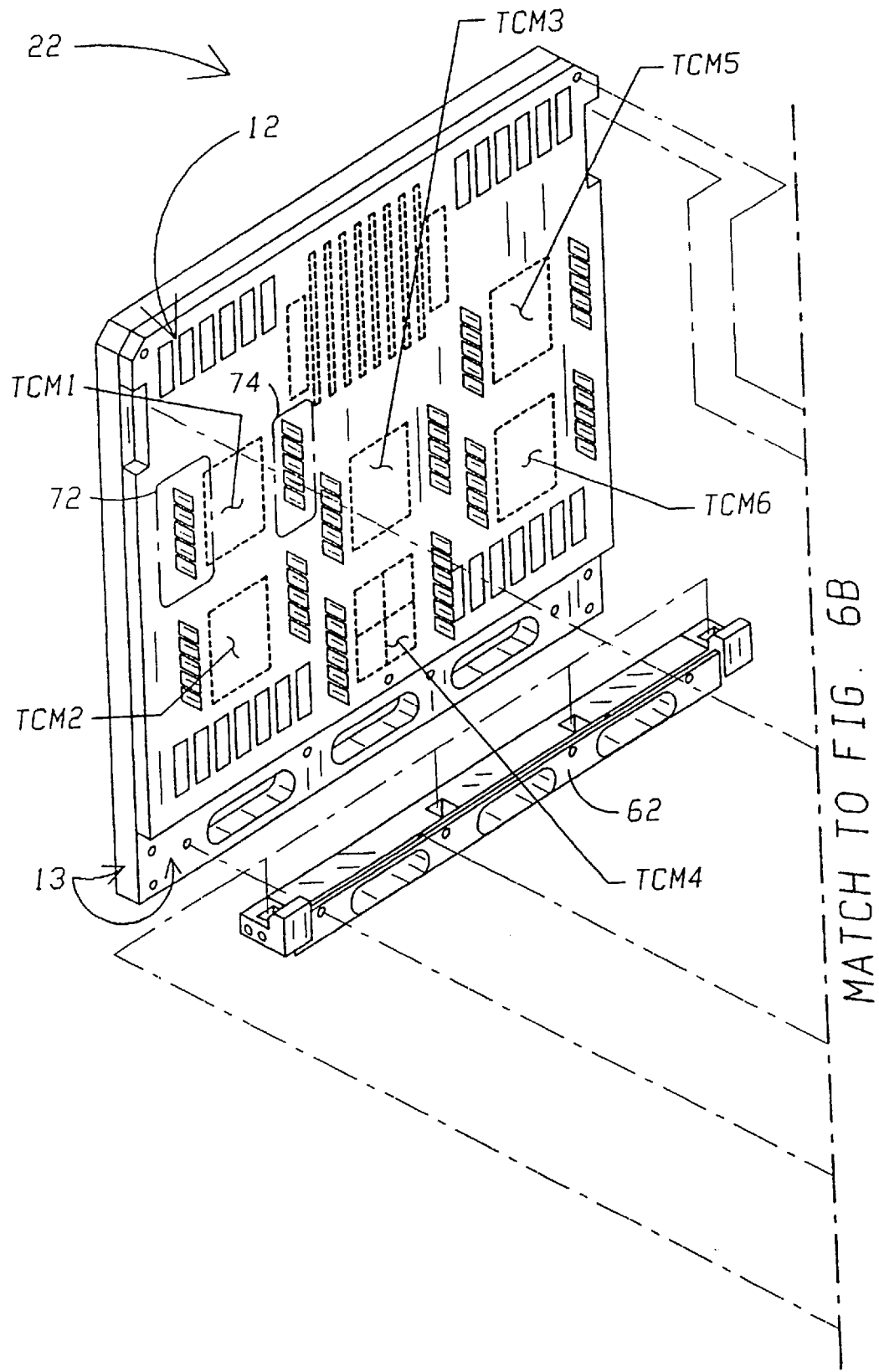
FIGS. 6(A–C) is an explosion of the assembly of FIG. 2.
Figure 6B:
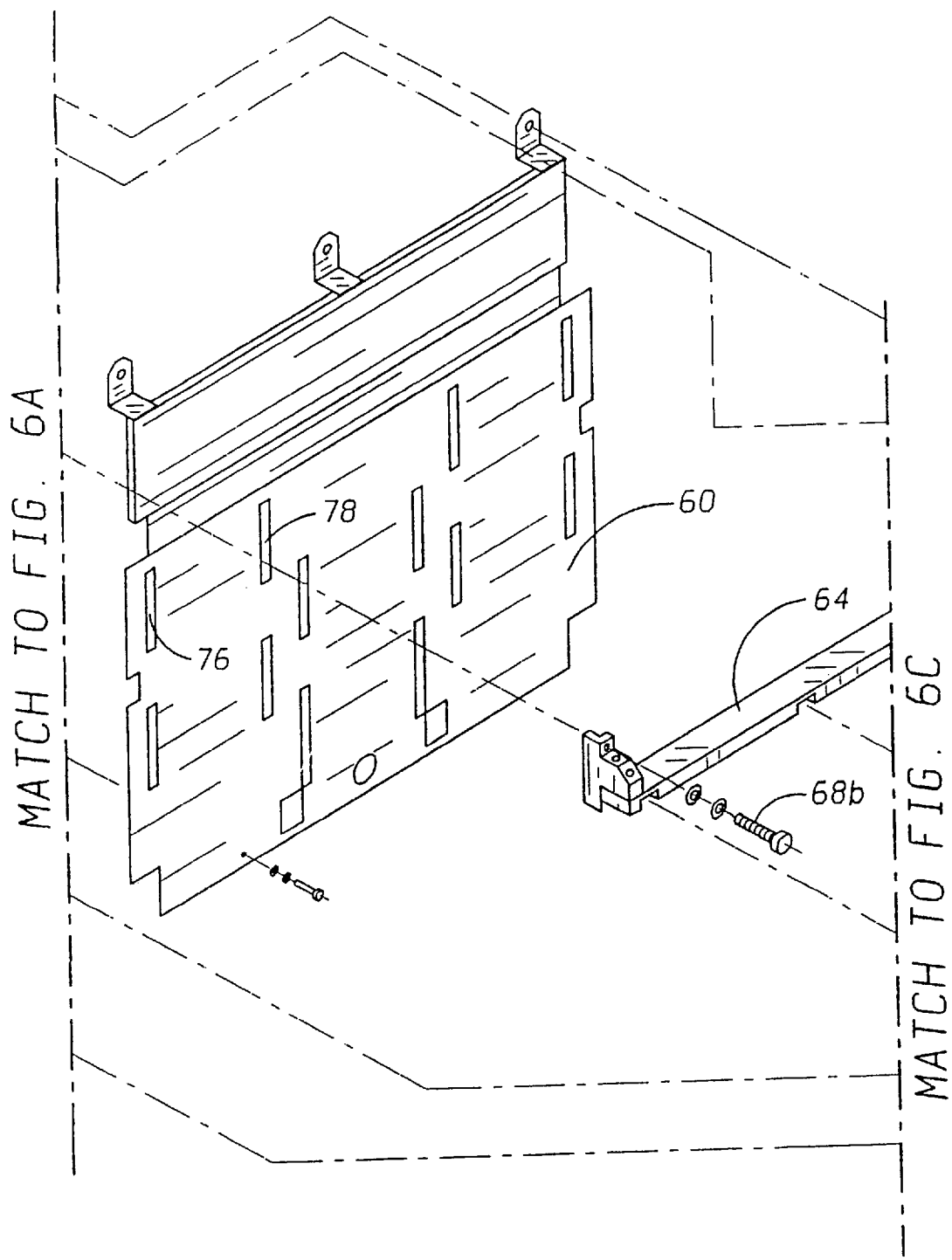

Referring now to FIG. 6, an exploded view of assembly 22 is shown. Assembly 22 includes circuit board 12 with a circuit board cover 60. Two support bars 62 and 64 are fastened to circuit board 12 with a plurality of screws, only three of which are shown as examples in FIG. 6 (66a, 68a and 68b).

Power bus 18 rests on support bars 62 and 64 and is fastened to circuit board 12 such that support bars 62 and 64 provide a space between power bus 18 and circuit board 12. Vertical portion 30 of the commoning section 26 of bus 18 rests on support bar 62 and is secured thereto by screw 66a and three other screws 66b–d as shown in FIG. 2. Screws 66a–d actually pass through bus 18 and support bar 62 and are screwed into an aluminum stiffener plate 13 epoxied to the front of the circuit board 12. The ends of bus legs 32, 34 and 36 fit in support bar 64 into three slots, A, B and C, respectively, as shown in FIG. 2. Thus, power bus 18 is securely fastened to circuit board 12 by screws 66a–d with support bars 62 and 64 providing a space between them.

Support bar 62 is comprised of aluminum and not only supports bus 18, but also serves as a securing block for cover 60 and a group of four retainers 70a–d more fully described below. Support bar 64 is also manufactured from aluminum and slots A, B and C within it are lined with vulcanized rubber. Accordingly, slots A, B and C insulate bus legs 32, 34 and 36, electrically, as well as provide protection from any mechanical shock or stress.

Cover 60 is comprised of sheet steel and provides a barrier that protects the components of circuit board 12 from any stray contact with personnel operating the computer system or falling objects during assembly of the computer system.

Assembly 22 also includes the four retainers 70a–d mentioned above. Retainers 70a–d are fastened with screws to the top of support bars 62 and 64. One end of each retainer 70a–d is inserted into a slot in support bar 62, and the other end is fastened to support bar 64. The retainers 70a–d are each comprised of an aluminum bar with a plurality of molded plastic covers that are each divided into a plurality of V-groove-shaped compartments to insure electrical isolation between the V-shaped connectors. The covers are attached to the aluminum bars with screws. Within each compartment are vulcanized, silicone rubber pressure pads that provide a downward force to the pluggable connectors to insure that the board tab solder joints remain in compression and the connector remains plugged during mechanical shock and vibration loads. Retainers 70a–d are only shown in FIG. 6 and not the other figures to provide a clear view of the V-shaped connectors in these other figures.

Circuit board 12 includes several rows of tabs that extend out perpendicularly from its surface. When assembly 22 is assembled for operation, each tab fits into the spring housing 48 of a corresponding V-shaped connector attached to power bus 18. Two rows of these tabs 72 and 74 are identified in FIG. 6.

Each row of tabs from circuit board 12 extends through a corresponding slot in cover 60 when assembly 22 is assembled. Thus, rows 72 and 74 extend through a pair of slots 76 and 78, respectively. When assembly 22 is assembled as shown in FIG. 2, each of the V-shaped connectors from bus 18 is fit or pressed onto the corresponding tab of circuit board 12. For example, rows of tabs 72 and 74 fit into banks of connectors 38 and 40, respectively.

There are 6 TCMs connected into circuit board 12. The position of the TCM's on circuit board 12 are identified in FIG. 6 as TCM1-6. Two rows of tabs extend from circuit board 12 on two vertical sides of each TCM. For example, rows 72 and 74 extend from circuit board 12 on the two vertical sides of TCM1. The close proximity of the TCM's to the tabs allows current to be conducted directly through the board power levels to the TCM without the need for clearance hole areas in the power levels. Accordingly, power is connected directly to each TCM on circuit board 12. In fact, power is delivered to two sides of each TCM, amply meeting the power requirements of each TCM.

Because inventive power bus 18 delivers power through the board in close proximity to the TCM, the disadvantages of prior art power buses that are connected to the perimeter of a circuit board are eliminated. In the prior art power buses the power had to be conducted through many inches of the circuit board to the power consuming device, which, as described above, created power losses across clearance holes required to insulate the power and signal conductors in the circuit board. Power bus 18 is attached as close as possible to the power consuming device (TCM), and thus, eliminates the power losses associated with conducting power through the clearance hole areas of the circuit board.

Furthermore, conducting power through circuit boards, as required by the prior art power buses, generates heat in the circuit board (due to the resistive nature of the clearance hole areas) that could cause the circuit board to malfunction. This heat problem is eliminated by the use of power bus 18.

In addition, power bus 18 is mechanically parallel to circuit board 12. Accordingly, assembly 22 requires far less space in computer system 10 than a conventional power bus/circuit board assembly in which the power bus is attached perpendicular to the front side of circuit board. Power bus 18 is fastened to circuit board 12 so that the entire assembly of circuit board 12 and power bus 18, assembly 22, requires only 3.5 inches or 9 centimeters of horizontal space in computer system 10. This results in 2 inches or 5 centimeters of saved space compared to the prior art perpendicular attachment of a power bus to a circuit board which requires 5.5 inches or 14 centimeters.

Figure 7:
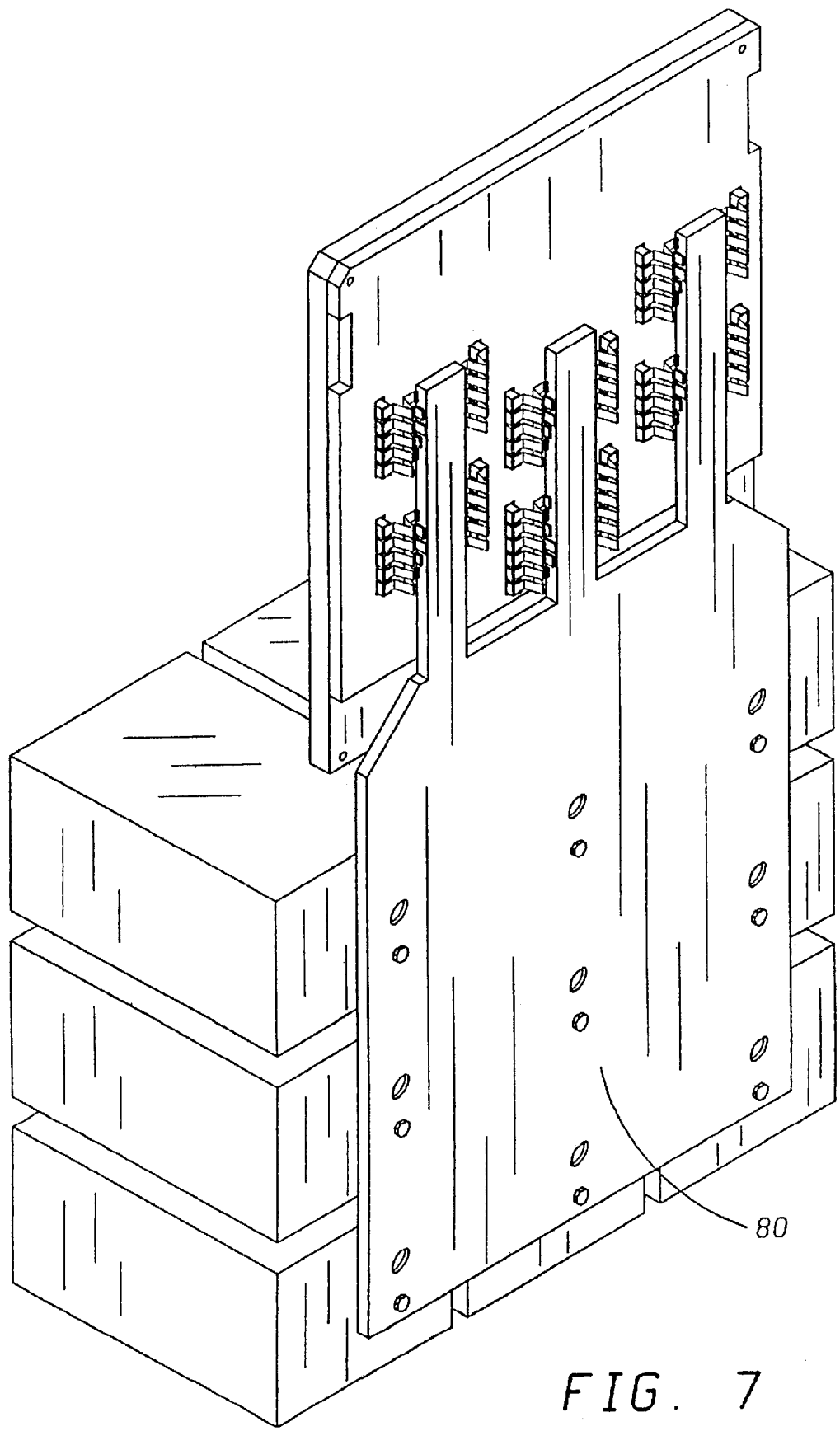
FIG. 7 is an alternate embodiment of the power bus of FIG. 2.

Referring now to FIG. 7, an alternative embodiment of the invention is shown. In the embodiment shown in FIG. 7, the power bus 18 and plate bus 20 of the preferred embodiment are combined into a single power bus 80. Power bus 80 is a laminated bus that may consist of four layers of conductive material similar to power bus 18. Power bus 80 also has three bus legs and a plurality of V-shaped connectors that are identical in operation and structure to the bus legs and connectors of power bus 18. The advantage of power bus 80 is that one of the power buses of the preferred embodiment as well as the connections between the two power buses are eliminated. However, a disadvantage of the embodiment shown in FIG. 7 compared to the preferred embodiment is that power bus 80 cannot be serviced without completely disconnecting it from the power supply matrix, while circuit board and power bus assembly 22 in the preferred embodiment can be easily removed from assembly 10 without disconnecting plate bus 20 from power supply matrix 16.

Accordingly, the preferred embodiment of a computer system with an improved power bus has been described. With the foregoing description in mind, however, it is understood that this description is made only by way of example, that the invention is not limited to the particular embodiments described herein, and that various rearrangements, modifications, and substitutions may be implemented without departing from the true spirit of the invention as hereinafter claimed.

We claim:

1. A power bus for conducting power from at least one power supply to a circuit board comprising:

at least one input from said at least one power supply for receiving electrical power from said at least one power supply;

at least one layer of conductive material for conducting electrical power received by said at least one input; and a plurality of connectors for conducting electrical power from said at least one layer to said circuit board, wherein each of said plurality of connectors comprises:

a V-shaped metallic portion for making electrical connection with the at least one layer of conductive material;

a U-shaped metallic portion for housing a pair of springs therein and for making electrical contact with the V-shaped metallic portion;

the pair of springs comprising a metallic portion for making electrical contact with the U-shaped metallic portion and the circuit board; and a hollow non-metallic shield for housing the U-shaped metallic portion.

2. The power bus of claim 1 wherein said power bus is substantially planar.

3. The power bus of claim 1 wherein said power bus is attached to said circuit board such that said power bus and said circuit board are parallel.

4. The power bus of claim 1 wherein said at least one layer of conductive material is a plurality of layers of conductive material laminated together.

5. The power bus of claim 1 wherein said plurality of connectors conducts electrical power from said at least one layer directly to a device connected to said circuit board.

6. The power bus of claim 5 wherein said plurality of connectors are pluggable.

7. A power bus assembly for a computer system comprising:

a power bus having a plurality of inputs for receiving electrical power in a plurality of different voltage and current values from a power supply;

said power bus further having a bus leg having a plurality of layers of conductive material connected to said plurality of inputs;

said bus leg being substantially planar and attached to a circuit board such that said layers of conductive material are parallel to said circuit board;

a plurality of connectors connecting said bus leg to said circuit board for conducting power in said plurality of different voltage and current values from said bus leg adjacent to a component connected to said circuit board and a circuit board cover disposed between the circuit board and the at least one layer of conductive material, wherein the circuit board cover comprises a planar surface having a plurality of slots configured to allow the plurality of connectors to extend there through.

8. The power bus assembly of claim 7 wherein the length of said bus leg is substantially equal to the length of said circuit board.

9. The power bus assembly of claim 7 wherein said component is a thermal controlled module.

10. The power bus assembly of claim 7 wherein said power bus is laminated.

11. The power bus assembly of claim 7 wherein said plurality of connectors are manually attachable and detachable from said circuit board.

12. The power bus assembly of claim 7 wherein said plurality of connectors have V-shaped portions.

13. The power bus assembly of claim 7 wherein each of said plurality of connectors has a spring housing.

14. The power bus assembly of claim 13 wherein two spring contacts made of electrically conductive metal fit into said spring housing.

15. The power bus of claim 7 wherein said plurality of connectors are not connected to the periphery of the circuit board.

16. A power bus assembly comprising:

a unitary power bus having a plurality of inputs for receiving electrical power in a plurality of different voltage and current values from a power supply;

said unitary power bus further having a bus leg with a plurality of layers of conductive material connected to said plurality of inputs; and a plurality of connectors connecting said bus leg to a circuit board for conducting power in said plurality of different voltage and current values from said bus leg adjacent to a component connected to said circuit board, wherein each of said plurality of connectors comprises:

a V-shaped metallic portion for making electrical connection with at least one layer of conductive material of the bus leg;

a U-shaped metallic portion for housing a pair of springs therein and for making electrical contact with the V-shaped metallic portion;

the pair of springs comprising a metallic portion for making electrical contact with the U-shaped metallic portion and the circuit board and a non-metallic shield for housing the U-shaped metallic portion.

17. The power bus assembly of claim 16 having a plurality of bus legs each having a plurality of layers of conductive material.

* * * * *